United States Patent [19]

Davis et al.

[11] Patent Number: 4,502,215

[45] Date of Patent: Mar. 5, 1985

[54] FEEDING ARTICLES TO SUCCESSIVE STATIONS FOR TREATMENT

[75] Inventors: Charles L. Davis, Mohnton; Charles R. Fegley, Laureldale; Jack H. Moll, Jr., Oley, all of Pa.

[73] Assignee: AT&T Technologies, Inc., New York, N.Y.

[21] Appl. No.: 451,357

[22] Filed: Dec. 20, 1982

[51] Int. Cl.[3] ...................... H01R 43/00; B23P 23/04; B65G 51/02

[52] U.S. Cl. ...................................... 29/874; 29/33 P; 406/83; 406/86; 140/147

[58] Field of Search ................ 140/147, 140; 198/345, 198/492; 406/92, 93, 94, 83, 86; 29/874

[56] References Cited

U.S. PATENT DOCUMENTS

| | | | |
|---|---|---|---|
| Re. 29,645 | 5/1978 | Kaminski | 406/94 X |
| 2,341,705 | 2/1944 | Fedorchak et al. . | |
| 2,395,146 | 2/1946 | Ray | 198/492 X |
| 2,632,553 | 3/1953 | Stirn et al. . | |
| 3,027,921 | 4/1962 | Mitchell, Jr. et al. | 140/147 |
| 3,144,889 | 8/1964 | Cole | 140/140 |
| 3,520,336 | 7/1970 | Zemek | 140/147 |
| 3,525,372 | 8/1970 | Haven | 140/147 |
| 3,568,823 | 3/1971 | Rettig et al. | 198/492 X |
| 3,645,581 | 2/1972 | Lasch, Jr. et al. . | |
| 4,049,123 | 9/1977 | Fegley et al. . | |
| 4,135,557 | 1/1979 | Ross et al. | 140/147 X |

*Primary Examiner*—Mark Rosenbaum
*Assistant Examiner*—Carl J. Arbes
*Attorney, Agent, or Firm*—D. C. Watson

[57] ABSTRACT

Individual ones of articles such as (LED) devices 10 are fed and positioned at one or more stations along a path traversed by the devices. A track 30 guidably advances the devices 10 in single file to and beyond stations 63 and 64 successively located along the path represented by a channel 35 in the track 30. An assembly 50 shuttles, transversely of the channel 35, a plurality of fingers 66–70 simultaneously from a working state to and from a transitory state with respect to devices 10 in channel 35. The fingers may be in the form of thin, upright blades 66–70 which are engaged to assembly 50 and extend substantially normally of and into channel 35 in response to the shuttling. An indexing blade 68 extends from the front of and into channel 35 when shuttling assembly 50 is in the working state to block a waiting file of devices 10. At stations 63 and 64, positioning blades 66 and 67, respectively, extend from the front of and into channel 35 when shuttling assembly 50 is in the working state to position respective devices 10 for treatment. At stations 63 and 64, detaining blades 69 and 70, respectively, extend from the back of and into channel 35 when shuttling assembly 50 is in the transitory state to block a respective device 10 from advancing beyond a respective station during the shuttling. The detaining blade 69 is spaced from the indexing blade 68 a distance suitable to cooperatively capture therebetween a device 10 from the waiting file during a shuttling cycle. Such device 10 is then released to blade 66 when shuttling assembly 50 is returned to the working state.

17 Claims, 7 Drawing Figures

FEEDING ARTICLES TO SUCCESSIVE STATIONS FOR TREATMENT

TECHNICAL FIELD

This invention relates to feeding articles to successive stations for treatment. More particularly, the invention relates to feeding individual articles and positioning the same at one or more treating stations along a path traversed by the articles.

BACKGROUND OF THE INVENTION

There are many advantages to advancing articles in a single file manner along a path for treatment. For example, articles are readily fed into and removed from such a file and article speed is readily controlled. Also, all articles in a close ordered file are readily started and stopped and each article is easily sensed or otherwise inspected. A problem is to apply an escapement to such a file so individual articles may be set apart for treatment. Another problem is to apply such an escapement to small, lightweight articles which are often difficult to handle.

Such small articles may include light emitting diodes (LEDs) which often have a tiny optical head and a pair of wire leads depending therefrom disposed along a plane. Portions of such articles are often treated in a successive manner. For example, the leads of such an LED may be trimmed at a first station and then shaped into a precise, offset configuration at a second station. It is advantageous to advance the LEDs in a single file for such treatment because of guiding and orientation problems. Therefore, it is desirable to apply an escapement to the file to feed individual articles and position the same at successive stations for treatment.

Single file escapements are provided in several forms in industries concerned with packaging materials in bottles. For example, in filling beverage bottles a single file thereof is advanced along a path by a conveyor belt. A typical escapement employs resilient fingers which are thrust across the belt in timed cycles to accurately space empty bottles on the moving belt. Thereafter, overhead means are moved in synchronism with the spaced bottles to perform work thereon. Another type of escapement controls a file of bottles at a filling station where successive leading bottles are stopped, filled and released and successive trailing bottles are indexed for the same treatment. Neither type of escapement feeds articles to successive stations along a path and positions the same for successive, but different treatments. Instead successive treatments are made by moving means parallel to and in time with spaced articles, or separate files of articles are created and each is stopped so leading articles may be treated.

Another advantage to advancing articles in a single file manner along a path is that a track structure may be utilized to guide and maintain orientation of the articles. Motive power may be provided by gravity, by mechanical means or often more conveniently, by fluid power. For example, articles such as silicon wafers in the electronics industry, are readily advanced in an easily observed, open track on a cushion of air. However, such a fluid powered track is not normally suitable for articles such as LEDs because they are generally devoid of major flat surfaces. Also, when escapements are utilized having fingers extending transversely of such a track, fluid flow is at least partially obstructed. Nevertheless, fluid powered tracks have desirable advantages such as simplicity, low cost and speed which make it attractive to use fluid power to advance articles such as LEDs for treatment.

Accordingly, it is desirable to develop new and improved expedients for feeding articles to successive stations for treatment. It is further desirable to feed the articles in a single file manner along a path to the stations. Individual articles should be singled out from a waiting file in the path and serially positioned at each successive station located along the same path. Such articles should be securely positioned and then securely repositioned for successive mechanical treatments at the successive stations.

It is also desirable to utilize a track structure to guidably advance the articles to the successive stations for treatment. Such track should guidably advance even small, lightweight articles which may be devoid of major, flat surfaces. Preferably the track should be fluid powered in such a manner that escapement fingers may be tolerated in the path without seriously impeding advancement of the articles.

SUMMARY OF THE INVENTION

Expedients are provided for feeding articles on an individual basis and positioning the same at one or more stations along a path traversed by the articles. For illustration purposes, the articles are small, lightweight devices which are utilized as light emitting diodes (LEDs) in the electronic industry. Expedients are provided to guidably advance the articles in a single file manner to and beyond one or more stations successively located along the path. An assembly is provided to shuttle transversely of the path, a plurality of fingers simultaneously in a cycle from a working state to a transitory state with respect to articles in the path. The plurality of fingers are each engaged to the shuttling assembly and extend substantially normally of and into the path in response to the shuttling.

An indexing finger extends from a first side, such as the front side of, and into the path when the shuttling assembly is in the working state. Such indexing finger blocks a leading waiting article to block a file thereafter. An article positioning finger is included at a first station in the path and at any successive station desired thereafter. Such finger extends from the front side of and into the path when the shuttling assembly is in the working state for positioning an article for treatment.

A detaining finger at each respective station extends from a second side, such as the back side of, and into the path when the shuttling assembly is in the transitory state. Such detaining finger blocks a respective article from advancing beyond the station during the shuttling. The detaining finger is spaced a distance prior to the station sufficient to avoid interference with expedients for treatment at the station. The detaining finger at the first station is spaced from the indexing finger a suitable distance along the path to accommodate the width of an article therebetween. Conveniently, the indexing finger and the first detaining finger cooperatively capture therebetween an article from the waiting file during a shuttling cycle. Such article, singled out from the file, is released to the first positioning finger when the shuttling assembly is returned to the working state.

In another embodiment, articles such as the LEDs, are guidably advanced in an elongated track structure extending substantially coextensively with and containing the desired path. Such track includes a channel shaped to substantially confine and guide the LEDs along the path. A succession of directional fluid passages are included extending through at least a portion of the track structure and into the channel. Such passages are oriented and disposed relative to the articles and the interior of the channel to impart as desired, a movement to the articles or a positional stability in cooperation with a positioning finger for treatment at a respective station. A supply of fluid such as compressed air, is in communication with the passages for moving or stabilizing the articles. In a preferred example, the channel confines a respective article as desired at a finger and the fluid passages are disposed both up and downstream of the finger such that the fluid supplied creates an upstream and overhead pressure and a downstream vacuum condition to move or stabilize an article along the path.

BRIEF DESCRIPTION OF THE DRAWING

The invention will be more readily understood from the following detailed description when read in conjunction with the accompanying drawing wherein.

Figure 1:
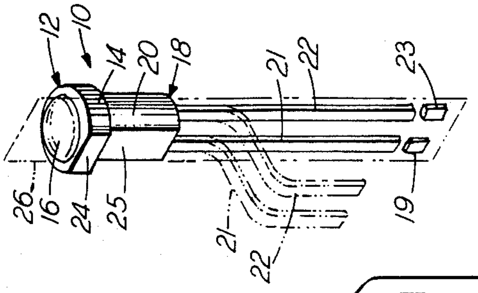
FIG. 1 is a pictorial view of an article which may be treated according to the practice of the invention.

It can be seen that some elements in the figure are abbreviated or simplified to highlight certain features of the invention. Also, where appropriate, reference numerals have been repeated in the figures to designate the same or corresponding features in the drawing.

DETAILED DESCRIPTION

The Articles

FIG. 1 illustrates a typical article 10 which may be treated in the practice of the invention. For purposes of illustration and discussion, such article 10 is selected from a class of lamps having solid state elements known in the electronics art and further referred to herein as LEDs or devices 10.

Such device 10 has an optical head 12 formed by a partial disc 14 supporting a dome-shaped lens 16. A body portion 18 depends from head 12 and, for the article 10 selected, such body includes a partial cylinder 20 and a pair of closely spaced parallel leads 21 and 22.

Optical head 12 encloses a light emitting diode formed in a chip (not shown) and the partial cylinder 20 protects vulnerable connections from the chip to the leads 21 and 22. Disc 14 and cylinder 20 have corresponding segments omitted to form polarity indicating features thereon known as flats 24 and 25, respectively. When device 10 is held with head 12 upright and flats 24 and 25 are turned toward a viewer as shown in FIG. 1, current flowing from lead 21 through the chip to lead 22 produces light transmitted primarily through dome lens 16.

For service mounting to a P-C board, the device 10 typically has leads 21 and 22 trimmed and shaped into an offset configuration shown in phantom lines in FIG. 1. It can be seen that the leads 21 and 22 are originally aligned parallel to one another in a plane 26 passing through the optical head 12. In the offset configuration leads 21 and 22 are still parallel to one another but bottom portions thereof are aligned in an offset plane parallel to plane 26 which is still maintained in the upper portions of the leads. Prior to forming the offset configuration, leads 21 and 22 have random sized portions 19 and 23, respectively, trimmed therefrom to obtain precise measurements in the finished device 10.

The purpose of the offset configuration during service mounting is to have the optical head at a precise position and elevation when leads 21 and 22 are inserted into board apertures for contact. Because of close packing on some boards, the dimensional tolerances in the finished leads are very close. For example, the lead length and offset distance are held to about ±0.005 inches of specification values. It will be appreciated that expedients for trimming and shaping leads 21 and 22 are carefully selected for such precise treatment.

It will be further appreciated that the offset configuration should be made at the side of plane 26 containing flats 24 and 25. Such flats provide an asymmetric feature to device 10 which is useful to control the successive treatments applied to leads 21 and 22. The flats are also useful expedients for guiding and maintaining uniform orientation of the devices as will be explained later.

Nevertheless, it will be seen that the invention is not limited to articles 10 which have the features of the described device 10. The invention is clearly applicable to a wide range of articles, each of which require successive treatments on an individual basis and which are amenable to single file handling. However, it is presently preferred to describe the invention with respect to device 10 because of the challenges associated therewith.

Guiding The Articles

Articles such as devices 10 are typically manufactured by some technique wherein a plurality thereof becomes disorganized. For example, the illustrated devices 10 are typically assembled in a lead frame environment wherein all LEDs are uniformly oriented with respect to each other. Unfortunately, when the devices 10 are separated from the lead frame they become disorganized and should be uniformly oriented for subsequent operations.

A disorganized mass of such devices 10 is typically loaded into the bowl of a vibratory feeder (not shown) and are fed laterally to one another along a single file. The file is guided by a feed track (not shown) which has walls and ledges to support and confine devices 10 and a continuous slot thereunder to guide the leads one behind another. Consequently the devices take on either of two orientations as they are advanced for uniform orientation at a turning station (not shown). Such guidably advancing and uniformly orienting asymmetrically shaped articles may be done by various expedients. A particularly advantageous expedient is set forth in a copending application, U.S. Ser. No. 430,581 entitled "Orienting Asymmetrically Shaped Articles", filed 9-30-82, and assigned to the same assignee as the present application. To the extent that additional information may be required herein, the application referred to is hereby incorporated herein and made a part hereof by this reference.

After the devices 10 are uniformly oriented, they are ready for mechanical treatment necessary to obtain the offset configuration in leads 21 and 22. In the preferred expedient for orienting articles, the devices 10 are laterally discharged into a single file track structure wherein orientation is maintained by restraining the leads one behind another in a continuous slot. It is desirable to further utilize such a track structure although conventionally such tracks are not amenable to mechanical treatment of articles therein. For example, normally articles are not readily firmly held in a track so close tolerance cutting and bending may be performed on the articles. Also, conventionally such tracks do not readily withstand physical abuse associated with mechanical treatment operations.

Nevertheless, it is desirable to perform the treatment while the articles are in a track rather than by diverting them into out-of-path stations. Such stations are typically expensive and diverting mechanisms are typically complex and wasteful of space. Also, the risk of damage to wire leads and optical heads is greater when LEDs are diverted to ancillary apparatus.

Figure 2:
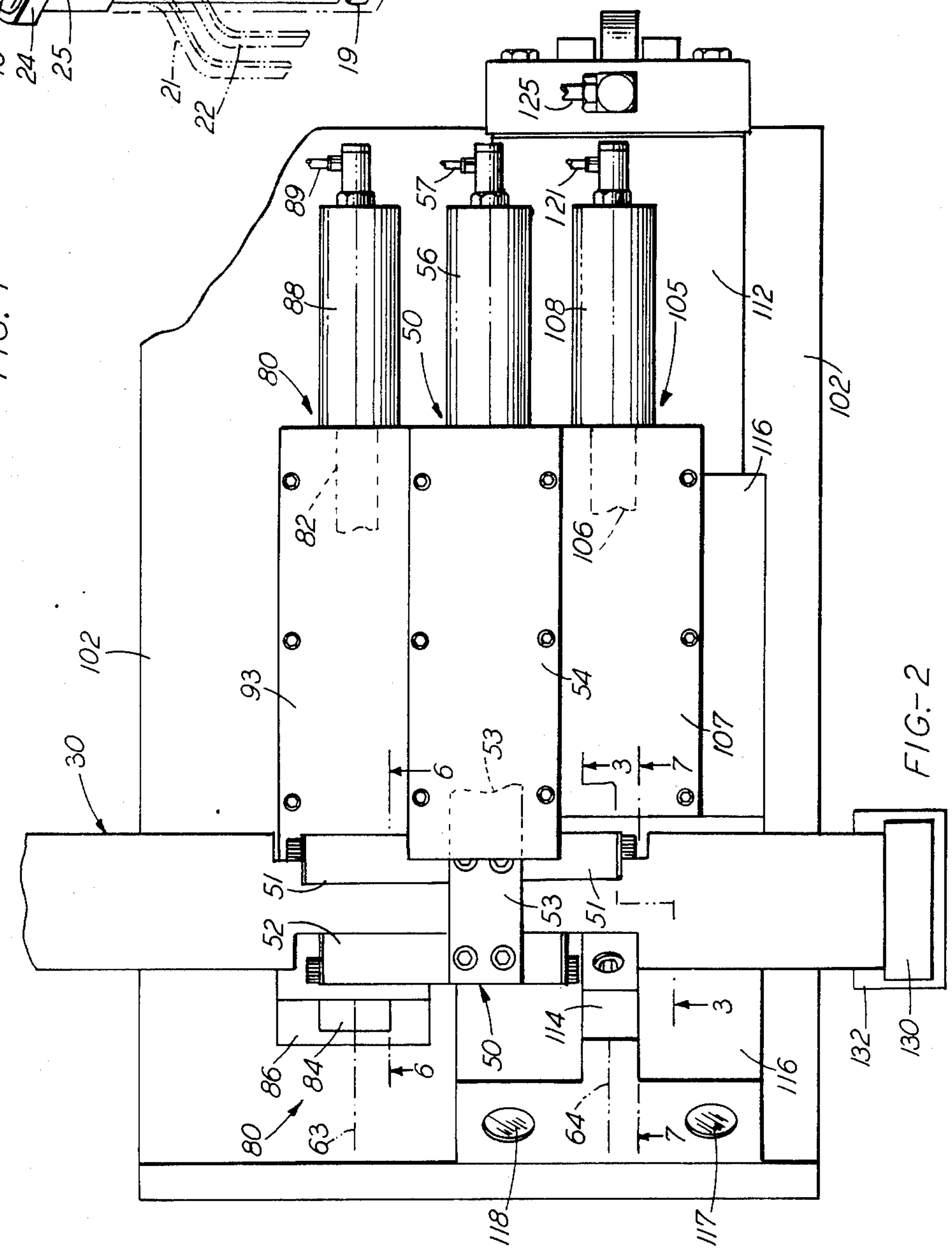
FIG. 2 is a plan view of apparatus for trimming and shaping leads of LEDs in accordance with the instant invention.

FIG. 2 shows apparatus for feeding articles in the desired manner and for mechanically treating the articles in a track structure. Such apparatus comprises a generally designated track structure 30, a shuttle assembly 50, a cutter 80 and a lead shaper 105, all mounted on a base 102.

Figure 3:
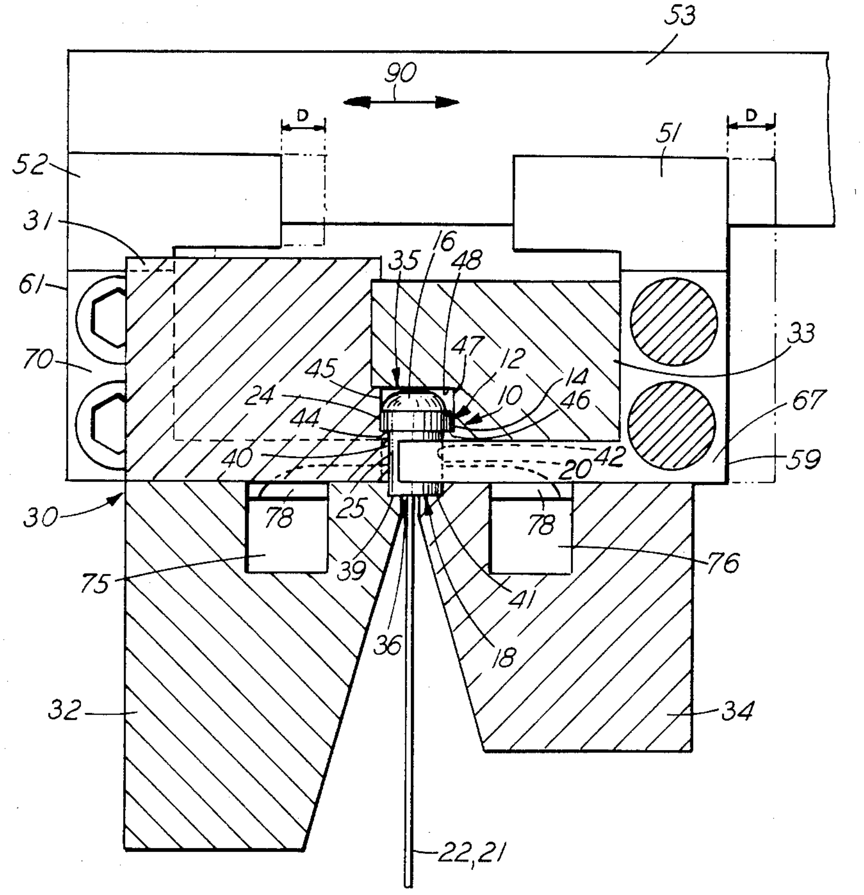
FIG. 3 is cross-sectional view of a track structure, part of the apparatus shown in FIG. 2 taken along line 3—3 showing, inter alia, portions of a shuttling assembly in a working state.

The track 30 is further seen in FIG. 3 which is a cross-sectional view taken along line 3—3 as shown in FIG. 2. Track 30 includes at least four elongated members 31, 32, 33 and 34 joined together to form a generally designated channel 35 to confine a device 10 for guidance. It will be shown that members 31–34 and channel 35 are elongated and define the path to be traversed by articles 10. It will also be shown that the interior of channel 35 is asymmetric with respect to a continuous slot 36 which accommodates the leads 21 and 22, one behind the other. Assuming slot 36 is formed along a rough centerline of track 30, it can be seen that there is more of channel 35 formed toward the right hand side of track 30 as shown in FIG. 3 (which side is further referred to herein as the front side of track 30). Conversely, there is less of channel 35 formed toward the left hand side of track 30 (which side is further referred to herein as the back side of track 30). It will be appreciated that channel 35 confines and guides an article 10 so well that leads 21 and 22 are accommodated by the slot 36 but neither such leads nor the slot are needed for guidance.

More specifically, a back ledge 39 and a wall 40 in cooperation with a front ledge 41 and a wall 42 support and guide the partial cylinder 20. A back ledge 44 and another wall 45 in cooperation with a front ledge 46 and wall 47 confine and guide the partial disc 14 and the ceiling 48 confines dome lens 16.

The device 10 shown in FIG. 3 may be an LED which is typically about $\frac{1}{8}$ inch in diameter by about $1\frac{1}{8}$ inches in length including about $\frac{1}{4}$ inch for the head 12 and cylinder 20 and such LED weighs about 0.0003 grams. Accordingly, much of the thickness of track 30 is not needed to confine and guide device 10. However, the thickness seen, in cooperation with the base 102 and supporting structure, is provided for stability and particularly to withstand the mechanical forces applied in cutting and shaping the leads 21 and 22.

Feeding The Articles

Figure 4:
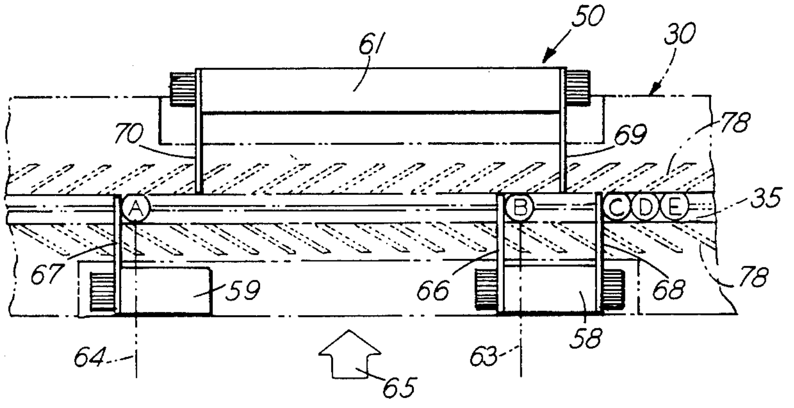
FIGS. 4 and 5 are plan views showing the track structure in phantom and schematically showing the shuttling assembly in the working and a transitory state, respectively.
Figure 5:
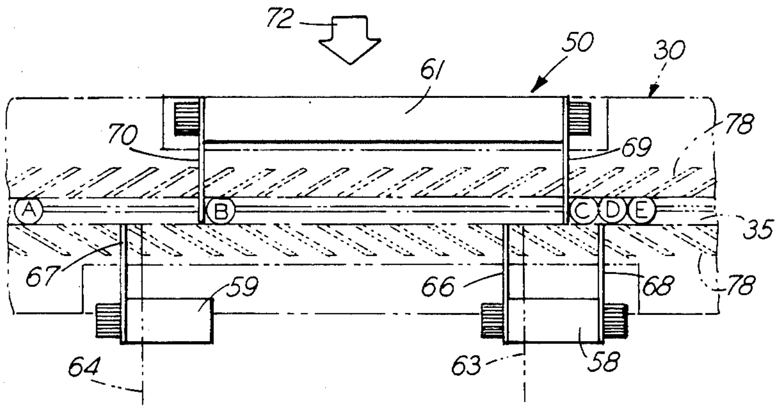

FIGS. 4 and 5 show plan views of track 30 in phantom lines and portions of a shuttling assembly designated generally by the numeral 50. Overhead portions of assembly 50 are best seen in FIGS. 2 and 3 including front and back support members 51 and 52, respectively, which are affixed to a push bar 53. Push bar 53 is guided by a groove (not shown) in a cover plate 54 and bar 53 is reciprocated transversely of track 30 by an air cylinder 56 operated by an air solenoid valve (not shown) which admits air into a fitting 57.

Three vertical members depend from support members 51 and 52 and are best seen in FIGS. 3–5. For example, support member 51 supports vertical members 58 and 59 at the front of track 30 and support member 52 supports vertical member 61 at the back of track 30, all such members being a part of assembly 50. By operation of cylinder 56 and bar 53, assembly 50 is reciprocated according to motion arrow 90 (FIG. 3) transversely of the path traversed by the articles 10, such path being represented in the drawing by channel 35.

The purpose of the shuttling assembly 50 is to feed individual ones of articles 10 from a waiting file of such articles and to position the same at one or more stations along channel 35 for treatment. In FIGS. 4 and 5 the articles 10 are represented by the dome lens 16 of devices 10 and each respective lens is further assigned a suffix letter from A-E and is labelled with the letter to signify the relative position along channel 35 of a device 10. Initially devices 10 are fed into channel 35 from the right side of the drawing which will be considered the upstream direction in channel 35. The devices 10 are aligned in a close ordered single file manner as they await treatment which means that the articles touch each other, at least at the discs 14.

FIG. 4 depicts a condition where article 10A has been treated at a first station 63 (such as by having leads trimmed) and is now positioned at a second successive station 64 for treatment (such as for having leads shaped). Of course, successive article 10B is now positioned at first station 63 for treatment and articles 10C–10E are in the waiting file.

The reciprocating motion of assembly 30 occurs in very short strokes and is, therefore, said to be a shuttling action. By such shuttling, a plurality of fingers 66–70 are simultaneously moved in a cycle from a working state shown in FIG. 4 to a transitory state shown in FIG. 5. By the working state it is meant that shuttle assembly 50 is moved back according to motion arrow 65 so the assembly is generally adjacent to the front side of track 30. Consequently, the positioning fingers 66 and 67 at stations 63 and 64, respectively, extend from the front side of track 30 into the channel 35 to position articles 10B and 10A, respectively, for treatment. An indexing finger 68 also extends in the same manner for blocking the leading waiting article 10C to block the file of articles including 10D and 10E thereafter.

FIGS. 3–5 show that when shuttling takes place, fingers 66–68 are withdrawn from channel 35 and such shuttling movement extends over a distance "D" about equal to the width of channel 35. The shuttling takes only an instant of time to successively release articles 10A–10E, detain articles 10B–10E and reposition articles 10B and 10C at stations 64 and 63, respectively. Since there is no intent to dwell halfway through the shuttling cycle the position of assembly 50 thereat (shown in FIG. 5) is referred to as a transitory state. By the transitory state, it is meant that shuttle assembly 50 is moved front according to motion arrow 72 so the assembly is generally against the back side of track 30. Consequently, the detaining fingers 69 and 70, disposed prior to stations 63 and 64, respectively, extend from the back side of track 30 into the channel 35 to detain articles 10B and 10C, respectively. Such detention occurs by temporarily blocking the same from advancing beyond the respective stations until such stations are clear of articles. The detaining fingers are each also spaced a distance prior to a respective station sufficient to avoid interference with means for treatment at the station.

The shuttling cycle is then completed by moving assembly 50 according to motion arrow 65 in FIG. 4 so the assembly 50 is again generally adjacent the front side of track 30 and fingers 66–68 again extend into the channel 35. Now articles 10B and 10C are released to the positioning fingers 66 and 67, respectively, at stations 63 and 64.

It is significant to note the unique cooperation between the first detaining finger 69 and the indexing finger 68 during the shuttling cycle. For example, indexing finger 68 does not release article 10C for advancement until detaining finger 69 is in such a position that article 10C cannot pass finger 69. Of course, it will be appreciated that the fingers need not extend completely across channel 35 to guarantee that an article will not escape during the shuttling cycle. However, it is desirable that the fingers extend at least so far that an article will not try to pass a subsequent finger and become jammed thereby. By setting the fingers more than halfway across channel 35 in either state shown in FIGS. 4 or 5, one can be sure that indexing occurs in a positive manner. Such positive indexing is especially desirable in a closed track where direct observation by an operator may not be available.

It will also be noted that detaining finger 69 at the first station 63 is spaced from the index finger 68 a distance along channel 35 suitable to accommodate the width of an article 10 therebetween. By such spacing the indexing finger 68 and the first detaining finger 69 cooperatively capture therebetween an article such as article 10C from the waiting file during a shuttling cycle. Fingers 68 and 69 also release the captured article to the first positioning finger 66 when the shuttling assembly 50 is returned to the working state.

Although the above discussion includes only two stations located along the path, it should be evident that the invention is not so limited. For example, with little modification the assembly 50 could be utilized to feed ones of articles 10 to only one station or to more than two stations. Such modifications would be within the skill and readily made by one of ordinary skill in the art.

Advancing The Articles

It has been mentioned that advancing articles by fluid powered track structures is a desirable expedient for handling articles due to simplicity, low cost and speed of such handling. However, it is not believed that fluid power, or at a least fluid bearing expedients, have heretofore been utilized to advance irregular and light articles such as devices 10 which are devoid of major flat surfaces. Even where irregular articles have been advanced in a tube, it is not believed that escapement blocking fingers have been tolerated in an article path. Nevertheless, applicants have found that a fluid powered track structure and method are desirable expedients when organized in the manner to be described.

FIG. 3 illustrates track structure 30 having elongated fluid supply conduits 75 and 76 which extend substantially coextensively with channel 35. Such supply conduits are not seen to be fully extensive with channel 35 because of interruptions at some stations. For example, it will be seen that a station 64 for shaping leads may interrupt both conduits 75 and 76 and a station 63 for cutting leads may interrupt only one conduit 76. However, such interruptions are of little consequence since they only require that additional sources of fluid supply be provided to an interrupted and/or isolated conduit.

From supply conduits 75 and 76 a succession of fluid passages 78 are provided to channel 35 extending through at least a portion of the track structure 30. Such passages are oriented in such a manner as to be directional, i.e., they are oriented to discharge fluid into channel 35 primarily in the direction toward which the article 10 are to be advanced. Such orientation takes into account the walls and ledges within channel 35, the shape and parts of articles 10 and the desired effect required upon such articles. Generally, although not always, the orientation of the passages 78 is intended to impart a movement to the articles 10. Consequently, it can be seen in FIG. 3 that the passages 78 discharge under disc 14 and upon cylinder 20 of a typical article 10. The effect of such orientation is to impart a desired lifting and advancing movement to such an article 10 as represented by device 10.

By reference to FIGS. 4 and 5, it can be seen that passages 78 are oriented at an angle to the channel 35 and the passages 78 are so disposed to impart a movement to the articles in a direction downstream of such channel. For example, with the given device 10, and the channel 35 previously described, it has been found that about 0.010 inch wide slots by about 0.03 inch high and cut at about a 30 degree angle to the centerline of channel 35 are adequate. When such slots are spaced on about 0.125 inch centers they provide a satisfactory movement to the devices and further avoid "dead" spots in the path, i.e., spots which have marginal or little fluid power for the work. Consequently, it is noted for a device 10 and the features and aspects of the invention described, the slots for passages 78 should be spaced about as close as the width of an article 10 to obtain the indicated results. Note that the passages extend into channel 35 and are coextensively located with respect to the length of the article channel.

Such passages 78 are also disposed relative to the articles 10 and the interior of the channel 35 to impart as desired, a positional stability to the devices 10. For example, where a finger extends transversely of and into channel 35, the passages 78 are disposed liberally on either side of the finger, the article being positioned and the channel 35. Consequently, it is found that such a fluid powered track provides unexpected stability for an article 10 which is mechanically treated.

In an illustrative additional example, overhead cylinders were utilized to initially drive the optical heads 12 and cylinders 20 downward to impart stability to the devices 10. However, when such cylinders were removed and the channel 35 was made reasonably air tight above the articles, it was found that the fluid conditions cooperating with other features at each station were adequate to stabilize the articles 10 for treatment.

Several observations were made to explain the aspect of positional stability provided by the fluid conditions.

For example, it was noted that the fluid flow when utilizing compressed air at 30–35 psig in the supply conduits 75 and 76 showed considerable air passing along the channel 35 of the track 30. Immediately adjacent to the discharge end the velocity was in excess of +3,000 feet per minute (FPM) and at the inlet end the velocity was about −760 FPM. It must also be noted that a small supply of air is drawn into the continuous slot 36 under and partially along channel 35. Consequently, it can be assumed that the fluid system serving track 30 draws about 1 part of air into channel 35 for every 3 parts fed from the source conduits 75 and 76 and that the total of about 4 parts is discharged from channel 35. In fact the vacuum available on the inlet end is sufficiently strong to readily draw a device 10 into channel 35 when such devices are held within about ¼ to ½ inch of the inlet.

From the above observation and the illustrative example we know that the fluid advancement of devices 10 operates on a push-pull basis. A pushing force is exerted against a device 10 at a positioning finger by upstream air pressure. Also a pulling force is applied to a device 10 at such a positioning finger by downstream vacuum. Such forces cooperate to provide a unique and unexpected positional stability to articles 10 stopped for treatment even though a finger partially obstructs the air flow.

In a more specific embodiment of the escapement described for feeding the articles and for advancing the same, a blade is used at least for indexing finger 68. For example, a 0.025 inch thick by 0.092 inch high blade made of blue spring steel provides an excellent finger for indexing the devices 10. Such a blade is sufficiently narrow (low in height in FIG. 3) and thin as to pass readily under head portions and between body portions (such as cylinders 20). This is especially evident when the devices 10 are in close-order, single file contact in channel 35. When all fingers 66–70 are represented by such blades the air flow seems to suffer little impediment to flow and the positional stability is markedly improved.

Trimming and Shaping the Articles

Figure 6:
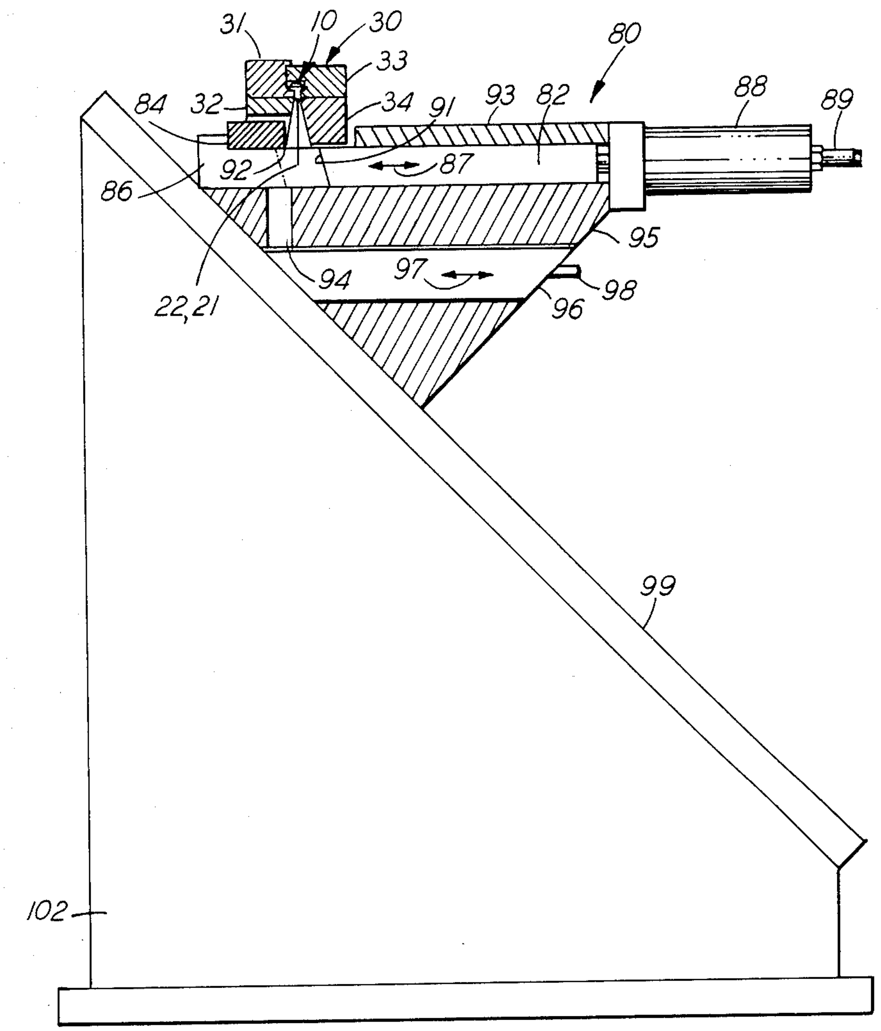
FIGS. 6 and 7 are cross-sectional views of the apparatus shown in FIG. 1 taken along lines 6—6 and 7—7, respectively, to show portions of successive trimming and shaping stations.
Figure 7:
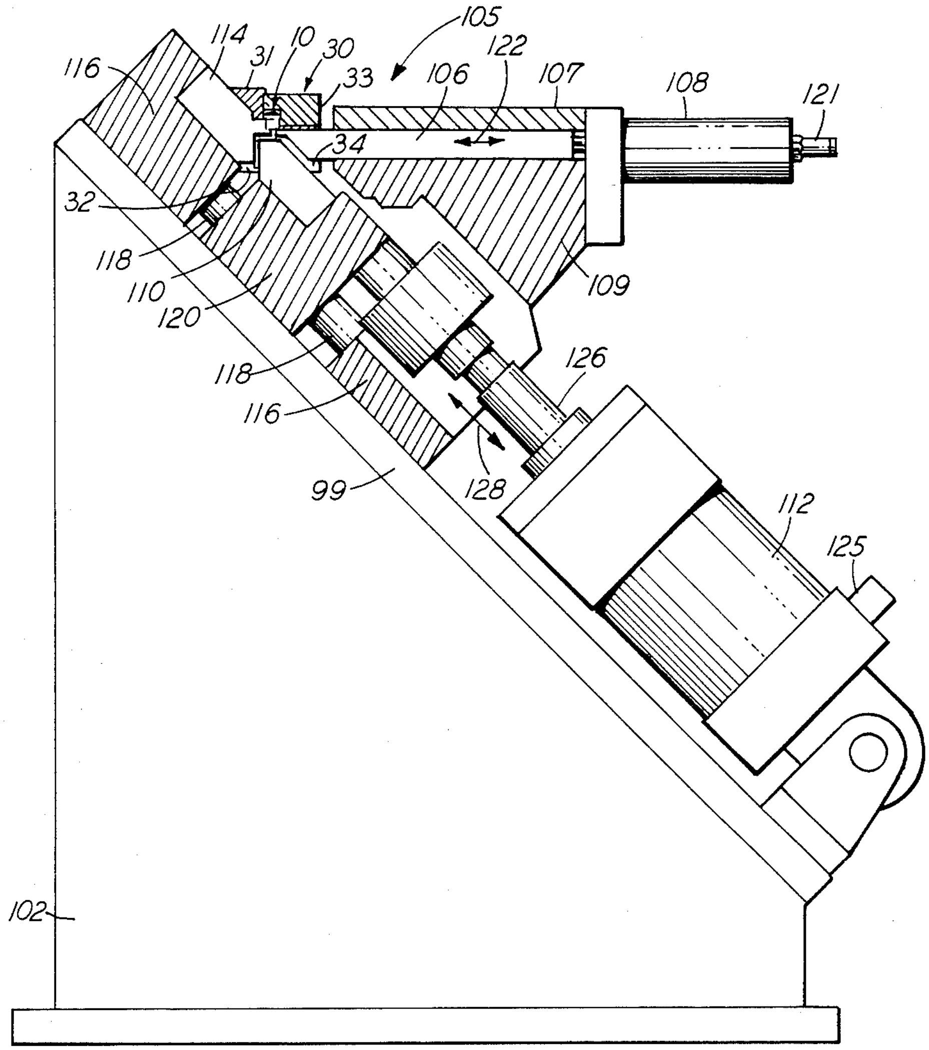

Referring to FIGS. 2, 6 and 7 there is seen apparatus for performing the mechanical treatments on devices 10 referred to with regard to FIG. 1. For example, the cutter 80 includes a movable bar cutting die 82 normally located at the front side of track 30 and adjacent to elongated member 34 (FIG. 6). Cutter 80 also includes a stationary cutting die 84 located at the back side of track 30 and adjacent to elongated member 32 (FIG. 6) which member is cut away to receive die 84 supported by a bracket 86. Die 82 is movable transversely of elongated track members 34 and 32 (FIG. 6) by action of air operated cylinder 88.

In operation of cutter 80, an article 10 such as a device 10 is fed and advanced to station 63 by operation of fluid powered track 30 and the shuttle assembly 50 and the device is positioned with stability at finger 66. An air solenoid valve (not shown) opens and air is admitted into a fitting 89 which operates cylinder 88. The movable bar die 82 is reciprocated according to arrow 87 such that a cutting edge 91 drives against a pair of leads 21 and 22 and deflects the same into cutting edge 91 of stationary die 84. The limit position of edge 91 is shown in phantom lines in FIG. 6 and such is sufficient to cleanly cut leads 21 and 22 to a desired uniform length. However, the limit position is insufficient to cause a permanent defecting set in the leads by the cutting.

Ancillary features and aspects can be further seen in FIG. 6. For example, the movable die 82 is guided by a groove (not shown) in cover plate 93. Also the random sized, trimmed lead portions 19 and 23 drop through a passageway 94 formed in support block 95 and fall into a tray 96. Tray 96 is movable for emptying and replacing according to arrow 97 by grasping and pulling handle 98. And block 95 is supported upon plate 99 which is in turn supported by base stand 102.

The lead shaper 105 (FIG. 1) includes a lead clamping bar 106 normally located at the front side of track 30 and adjacent elongated member 34 which has been almost fully cut away at station 64 (FIG. 7). Bar 106 is guided by a groove (not shown) in cover plate 107 and is movable transversely of elongated member 34 by action of air operated cylinder 108 supported by a block 109. Shaper 105 also includes a movable forming die 110 (FIG. 7) located at the front side of track 30 and adjacent end portions of elongated member 34. Die 110 is movable at about a forty-five degree angle to a horizontal plane and transversely of track 30 (FIG. 7) by action of a ram driven by an air operated cylinder 112 supported on plate 99 and stand 102. Shaper 105 further includes a stationary forming die 114 located at the back side of track 30 and adjacent end portions of elongated member 32 which has been cut away at station 64. Die 114 and ancillary parts of shaper 105 are supported by a large block 116 as shown in FIGS. 1 and 7. A pair of guide rails 117 and 118 (only 118 shown in FIG. 7) are supported by large block 116 to guide a movable block 120 which movably supports forming die 110.

In operation of shaper 105, an article 10 such as a device 10 is fed and advanced to station 64 by operation of fluid powered track 30 and the shuttle assembly 50 and the device is stably positioned at station 64. An air solenoid valve (not shown) opens and air is admitted into a fitting 121 to operate cylinder 108. The movable clamping bar 106 is reciprocated according to arrow 122 to drive its clamping nose against a pair of leads 21 and 22 and clamp the same to one surface of stationary die 114. Then another air solenoid valve (not shown) opens and air is admitted into a fitting 125 to operate cylinder 112 and its drive shaft 126 to translate movable blade 120. According to arrow 128 the movable die 110 is reciprocated to drive its forming surfaces against a trimmed pair of leads 21 and 22 of a device 10 into the forming surfaces of stationary die 114 sufficiently to form the desired shape in such leads. Upon return of shaft 126, block 120 and movable die 110, the cylinder 108 releases clamping bar 106 and draws it away from track 30. The positioning finger 67 retracts in a shuttling cycle and the now trimmed and formed device 10 is free to advance out the discharge end of channel 35 shown at the bottom of FIG. 2. A deflector plate 130 redirects the finished device 10 into a container 132.

It should be mentioned that clamping bar 106 and its operating features are optionally utilized in the practice of the invention. One can obtain satisfactory shaping without the clamping function but the clamp is often desirable for articles 10 requiring very close tolerances. The clamping function is also advantageous in protecting vulnerable features of an article 10 such as the optical head 12 of a device 10 during the lead shaping treatment.

What is claimed is:

1. Apparatus for feeding ones of articles and positioning the same at one or more stations along a path traversed by the articles, comprising;

means for guidably advancing the articles in a single file manner to and beyond the stations successively located along the path;

means for shuttling transversely of the path, a plurality of fingers simultaneously in a cycle from a working state to and from a transitory state with respect to articles in the path;

a plurality of fingers, each engaged to said shuttling means and extending substantially normally of and into said path in response to said shuttling including:

an indexing finger for blocking a file of waiting articles and, at a first station in the path and at any successive station desired thereafter, a positioning finger for positioning an article for treatment, all such fingers extending from a first side of and into the path when the shuttling means is in the working state;

at each respective station, a detaining finger extending from a second side of and into the path when the shuttling means is in the transitory state for blocking a respective article from advancing beyond such station during the shuttling; and the detaining finger at the first station being spaced from the indexing finger a distance suitable to cooperatively capture therebetween an article from the waiting file during a shuttling cycle and to release the same to the first positioning finger when the shuttling means is returned to the working state.

2. Apparatus as in claim 1 wherein the means for guidably advancing the articles along the path further comprises:

an elongated track structure extending substantially coextensively with and containing the path, including:

a channel shaped to substantially confine and guide the articles along the path;

a succession of directional fluid passages extending through at least a portion of the track structure, into the article channel;

said passages being oriented and disposed relative to the articles and the interior of the channel to impart as desired, a movement to said articles or a positional stability in cooperation with a positioning finger at a respective station; and a supply of fluid in communication with said passages for moving or stabilizing said articles.

3. Apparatus as in claim 2 wherein the channel, the fluid passages and the fluid supply cooperate with the articles at least at a finger in the path to move or stabilize the same at least partially by vacuum pulling said articles along the path.

4. Apparatus as in claim 2 wherein the passages at the article channel are spaced apart no greater than the width of an article being advanced.

5. Apparatus as in claim 2 wherein each article has a head portion and a narrower body portion depending therefrom and wherein at least the indexing finger further comprises:

a upright blade which is sufficiently narrow and thin to pass readily under head portions and between body portions when such articles are in close-order single file contact in the channel.

6. Apparatus as in claim 5 wherein the body portion of each article includes a pair of leads depending from and lying along a plane passing through the head and wherein the track structure further comprises:

a slot in the track to accommodate the leads one behind another to restrain each article from turning as the articles are advanced.

7. Apparatus as in claim 6 wherein the first station in the path for treating articles comprises:

first and second cutting dies located at first and second sides, respectively, of the path and adjacent to portions of the track traversed by the leads;

means for moving at least one of the dies against a pair of leads of an article positioned at the station and for deflectively driving such leads into the other die sufficiently to cleanly cut the pair of leads to a desired uniform length, the deflecting of such leads being insufficient to cause a permanent deflecting set in the leads by the cutting.

8. Apparatus as in claim 7 wherein there is located successively of the first station, a second station in the path for treating articles, further comprising:

first and second forming dies located at first and second sides, respectively, of the path in the track and adjacent to portions of the track traversed by the leads; and means for moving at least one of the dies against a pair of leads of an article positioned at the station and for driving such leads into the other die sufficiently to form a desired shape in the leads of such article.

9. A fluid powered track for guidably advancing articles along a path, comprising:

an elongated track structure extending substantially coextensively with and containing the path, including:

a channel shaped to substantially confine and guide the articles in a single file along the path;

a succession of directional fluid passages extending through at least a portion of the track structure, into the article channel;

said passages being oriented and disposed relative to the articles and the interior of the channel to impart as desired, a movement to said articles or a positional stability in cooperation with positioning means at a desired station in the path;

a supply of fluid in communication with said passages for moving or stabilizing said articles; and said fluid passages and said fluid supply cooperating with the articles, at least at a finger in the path, to move or stabilize the same at least partially by vacuum pulling said articles along the path.

10. A track as in claim 9 wherein the passages at the article channel are spaced no greater than the width of an article being advanced.

11. A method of feeding ones of articles and positioning the same at one or more stations along a path traversed by the articles, comprising:

guidably advancing the articles in a single file manner to and beyond the stations successively located along the path;

shuttling transversely of the path, a plurality of fingers simultaneously in a cycle from a working state to and from a transitory state with respect to articles in the path;

thrusting substantially normally of and into said path in response to said shuttling, a plurality of fingers, each engaged to said shuttling means, said plurality including:

an indexing finger for blocking a file of waiting articles and, at a first station in the path and at any successive station thereafter, an article positioning finger for positioning an article for treatment all such fingers being extended from a first side of and into the path when the shuttling means is in the working state;

a detaining finger at each respective station, from a second side of and into the path when the shuttling means is in the transitory state for blocking a respective article from advancing beyond the station during the shuttling; and the indexing finger being spaced from the detaining finger at a first station, a suitable distance along the path to accommodate the width of an article therebetween such that the indexing finger and the first detaining finger cooperatively capture therebetween an article from the waiting file during a shuttling cycle and release the same to the first positioning finger when the shuttling means is returned to the working state.

12. A method as in claim 11 wherein the step of guidably advancing the articles along the path further comprises:

guiding the articles along a channel formed within a track structure and shaped to substantially confine and guide such articles along the path;

introducing fluid into a succession of directional fluid passages extending through at least a portion of the track structure and into the article channel; and orienting and disposing said passages relative to the articles and the interior of the channel to impart as desired, a forward movement to said articles or a positional stability in cooperation with a positioning finger at a respective station.

13. A method as in claim 12 wherein during the advancing step, the channel, the passages and the fluid cooperate with the articles, at least at a finger in the path, to move or stabilize the articles at least partially by vacuum pulling said articles along the path.

14. A method as in claim 12 wherein each article has a head portion and a narrower body portion depending therefrom and wherein at least the step of extending the indexing finger further comprises:

extending an upright blade which is sufficiently narrow and thin to pass readily under head portions and between body portions when such articles are in close-order, single file contact in the channel.

15. A method as in claim 14 wherein the body portion of each article includes a pair of leads depending from and lying along a plane passing through the head and wherein guiding the articles along the track structure further comprises:

guiding the leads one behind another along a slot in the track to restrain each article from turning as the articles are advanced.

16. A method as in claim 15 wherein treating an article at the first station in the path comprises:

locating first and second cutting dies at first and second sides, respectively, of the path and adjacent to portions of the track traversed by the leads;

moving at least one of the dies against a pair of leads of an article positioned at the station and deflectively driving such leads into the other die sufficiently to cleanly cut the pair of leads to a desired uniform length, the deflecting of such leads being insufficient to cause a permanent deflecting set in the leads by the cutting.

17. A method as in claim 16 wherein treating an article at a second station, located successively of the first station in the path comprises:

locating first and second forming dies at first and second sides, respectively, of the path and adjacent to portions of the track traversed by the leads;

moving at least one of the dies against a pair of leads of an article positioned at the station and driving such leads into the other die sufficiently to form a desired shape in the leads of each article.

* * * * *